United States Patent
Song et al.

(10) Patent No.: US 9,123,898 B2
(45) Date of Patent: Sep. 1, 2015

(54) PHOSPHORESCENT COMPOUND AND ORGANIC LIGHT EMITTING DIODE DEVICE USING THE SAME

(71) Applicant: LG Display Co., Ltd., Seoul (KR)

(72) Inventors: In-Bum Song, Seoul (KR); Jung-Keun Kim, Seoul (KR); Joong-Hwan Yang, Gwangmyeong-si (KR)

(73) Assignee: LG Display Co., Ltd., Seoul (KR)

(*) Notice: Subject to any disclaimer, the term of this patent is extended or adjusted under 35 U.S.C. 154(b) by 181 days.

(21) Appl. No.: 13/945,094

(22) Filed: Jul. 18, 2013

(65) Prior Publication Data
US 2014/0034922 A1 Feb. 6, 2014

(30) Foreign Application Priority Data
Jul. 31, 2012 (KR) .................. 10-2012-0083762

(51) Int. Cl.
H01L 35/24 (2006.01)
H01L 51/00 (2006.01)
C09K 11/06 (2006.01)
H01L 51/50 (2006.01)

(52) U.S. Cl.
CPC ............ H01L 51/0067 (2013.01); C09K 11/06 (2013.01); H01L 51/0072 (2013.01); C09K 2211/1029 (2013.01); C09K 2211/1044 (2013.01); H01L 51/0073 (2013.01); H01L 51/0085 (2013.01); H01L 51/5016 (2013.01); H01L 2251/308 (2013.01)

(58) Field of Classification Search
CPC ............ H01L 51/0541; H01L 51/0545; H01L 51/0036; H01L 51/5012; B82Y 10/00
USPC ............................................. 257/40, E51.001
See application file for complete search history.

(56) References Cited

U.S. PATENT DOCUMENTS

| | | | | |
|---|---|---|---|---|
| 4,171,444 A * | 10/1979 | Beschke et al. | ............... | 546/250 |
| 4,720,432 A * | 1/1988 | VanSlyke et al. | ............. | 428/457 |
| 5,077,142 A * | 12/1991 | Sakon et al. | .................. | 428/690 |
| 2008/0176105 A1* | 7/2008 | Shin et al. | ..................... | 428/704 |
| 2012/0153272 A1 | 6/2012 | Fukuzaki | | |

FOREIGN PATENT DOCUMENTS

CN 102382105 A 3/2012
CN 102459506 A 5/2012
(Continued)

OTHER PUBLICATIONS

Japan Patent Office, Office Action, Japanese Patent Application No. 2013-154611, Aug. 26, 2014.
(Continued)

*Primary Examiner* — Anthony Ho
(74) *Attorney, Agent, or Firm* — Fenwick & West LLP

(57) ABSTRACT

The present invention provides a phosphorescent compound of following formula:

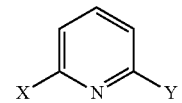

wherein each of X and Y is independently selected from an aromatic group and a heterocyclic group.

12 Claims, 7 Drawing Sheets

(56) References Cited

FOREIGN PATENT DOCUMENTS

| | | |
|---|---|---|
| JP | 2009-015787 A | 1/2009 |
| JP | 2010-114180 A | 5/2010 |
| JP | 4474493 B1 | 6/2010 |
| JP | 2011-091356 A | 5/2011 |
| KR | 10-2012-0072787 A | 7/2012 |
| WO | WO 2012/077520 A1 | 6/2012 |

OTHER PUBLICATIONS

Son, K.S. et al., "Analyzing Bipolar Carrier Transport Characteristics of Diarylamino-Substituted Heterocyclic Compounds in Organic Light-Emitting Diodes by Probing Electroluminescence Spectra," *Chemical Materials*, 2008, pp. 4439-4446, vol. 20, No. 13.

State Intellectual Property Office of the People's Republic of China, Office Action, Chinese Patent Application No. 201310322267.8, Jan. 7, 2015, fifteen pages.

* cited by examiner

PHOSPHORESCENT COMPOUND AND ORGANIC LIGHT EMITTING DIODE DEVICE USING THE SAME

CROSS-REFERENCE TO RELATED APPLICATION

The present application claims the benefit of Korean Patent Application No. 10-2012-0083762 filed in Korea on Jul. 31, 2012, which is herein incorporated by reference.

BACKGROUND OF THE INVENTION

1. Field of the Invention

The present invention relates to a phosphorescent compound and an organic light emitting diode (OLED) device and more particularly to a phosphorescent compound having improved emitting efficiency due to high triplet energy and broad energy band gap and an OLED device using the same.

2. Discussion of the Related Art

Recently, requirement for flat panel display devices having small occupied area is increased. Among the flat panel display devices, OLED devices have been widely introduced.

The OLED device emits light by injecting electrons from a cathode as an electron injection electrode and holes from an anode as a hole injection electrode into an emission compound layer, combining the electrons with the holes, generating an exciton, and transforming the exciton from an excited state to a ground state. A flexible substrate, for example, a plastic substrate, can be used as a base substrate where elements are formed. Since the OLED device does not require a backlight assembly, the OLED device has low weight and low power consumption. Moreover, the OLED device can be operated at a voltage (e.g., 10V or below) lower than a voltage required to operate other display devices. In addition, the OLED device is adequate to produce full-color images.

A general method for fabricating OLED device will be briefly explained below.

(1) First, an anode is formed on a substrate by depositing a transparent conductive compound, for example, indium-tin-oxide (ITO).

(2) Next, a hole injection layer (HIL) is formed on the anode. For example, the HIL may be formed of 4,4'-bis[N-[4-{N,N-bis(3-methylphenyl)amino}phenyl]-N-phenylamino]biphenyl (DNTPD), which is represented in following Formula 1-1, and have a thickness of about 10 nm to about 30 nm.

(3) Next, a hole transporting layer (HTL) is formed on the HIL. For example, the HTL may be formed of 4,4'-bis[N-(1-naphtyl)-N-phenylamino]-biphenyl (NPB), which is represented in following Formula 1-2, and have a thickness of about 30 nm to about 60 nm.

(4) Next, an emitting compound layer (EML) is formed on the HTL. A dopant may be doped onto the EML. In a phosphorescent type, the EML may be formed of 4,4'-N,N'-dicarbaxole-biphenyl (CBP), which is represented in following Formula 1-3, and have a thickness of about 30 nm to about 60 nm, and tris((3,5-difluoro-4-cyanophenyl)pyridine)iridium (III) (FCNIr), which is represented in following Formula 1-4, as the dopant may be doped to form a blue emitting material pattern. In addition, for displaying full color image, red and green emitting material patterns are formed.

(5) Next, an electron transporting layer (ETL) and an electron injection layer (EIL) are stacked on the EML.

(6) A cathode is formed on the EIL, and a passivation layer is formed on the cathode.

[Formula 1-1]

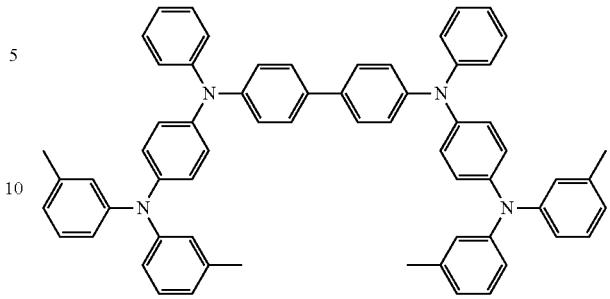

[Formula 1-2]

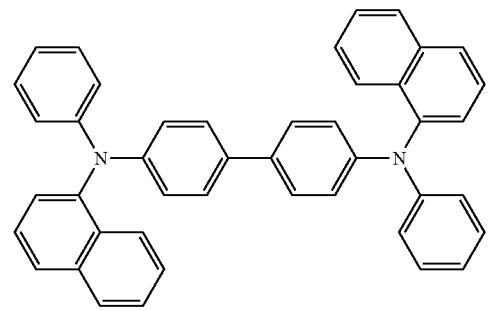

[Formula 1-3]

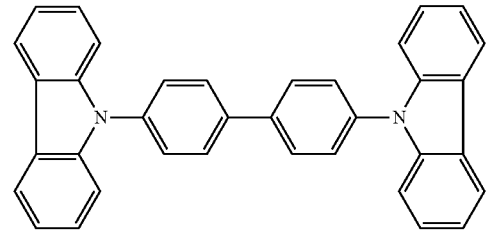

[Formula 1-4]

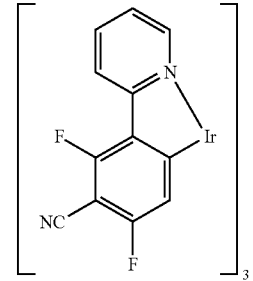

Recently, a phosphorescent compound is more widely used for the emission layer than a fluorescent compound. The fluorescent compound only uses singlet energy corresponding to about 25% of excitons for emitting light, and triplet energy corresponding to about 75% of excitons is lost as a heat. However, the phosphorescent compound uses not only the singlet energy but also the triplet energy for emitting light. The phosphorescent dopant includes a heavy atom, such as iridium (Ir), at a center of an organic compound and has a high electron transition probability from the triplet state to the single state.

However, the efficiency of the dopant is rapidly decreased because of a quenching phenomenon such that there is a limitation in the emitting material layer of the dopant without a host. Accordingly, it is desired to form the emitting material layer by the dopant with the host having higher thermal stability and triplet energy.

In the OLED device including the phosphorescent compound, a hole from the anode and an electron from the cathode combine at the host of the emitting material layer. Energy transition of a singlet exciton from the host into a singlet or triplet energy level of the dopant is generated, and energy transition of a triplet exciton from the host into the triplet energy level of the dopant is generated. The exciton into the singlet energy level of the dopant is transited again into the triplet energy level of the dopant. Namely, all excitons are transited into the triplet energy level of the dopant. The excitons in the triplet energy level of the dopant are transited into a ground state such that the emitting material layer emits light.

For an efficient energy transition into the dopant, a triplet energy of the host should be larger than that of the dopant. When the triplet energy of the host is smaller than that of the dopant, an energy counter-transition from the dopant to the host is generated such that an emission yield is reduced.

Referring to FIG. 1, CBP, which is widely used for the host, has a triplet energy level of about 2.6 eV, a highest occupied molecular orbital (HOMO) level of about −6.3 eV, and a lowest occupied molecular orbital (LUMO) level of about −2.8 eV. Accordingly, with a blue phosphorescent dopant of FCNIr, which has a triplet energy level of about 2.8 eV, a HOMO level of about −5.8 eV, and a LUMO level of about −3.0 eV, an energy counter-transition from the dopant to the host is generated such that an emission yield is decreased. Particularly, the emission yield decrease is remarkably generated in a low temperature condition.

SUMMARY OF THE INVENTION

Accordingly, the present invention is directed to a phosphorescent compound and an OLED device using the same that substantially overcomes one or more of the problems due to limitations and disadvantages of the related art.

An object of the present invention is to provide a phosphorescent compound having high triplet energy and broad energy band gap.

Another object of the present invention is to provide an OLED having improved emission efficiency.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, the present invention provides a phosphorescent compound of following formula:

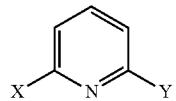

wherein each of X and Y is independently selected from an aromatic group and a heterocyclic group.

In another aspect of the present invention, the present invention provides an organic light emitting diode device including a first electrode; a second electrode facing the first electrode; and an emitting material layer between the first and second electrodes, wherein the emitting material layer includes a phosphorescent compound of following formula:

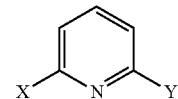

wherein each of X and Y is independently selected from an aromatic group and a heterocyclic group.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Figure 1:
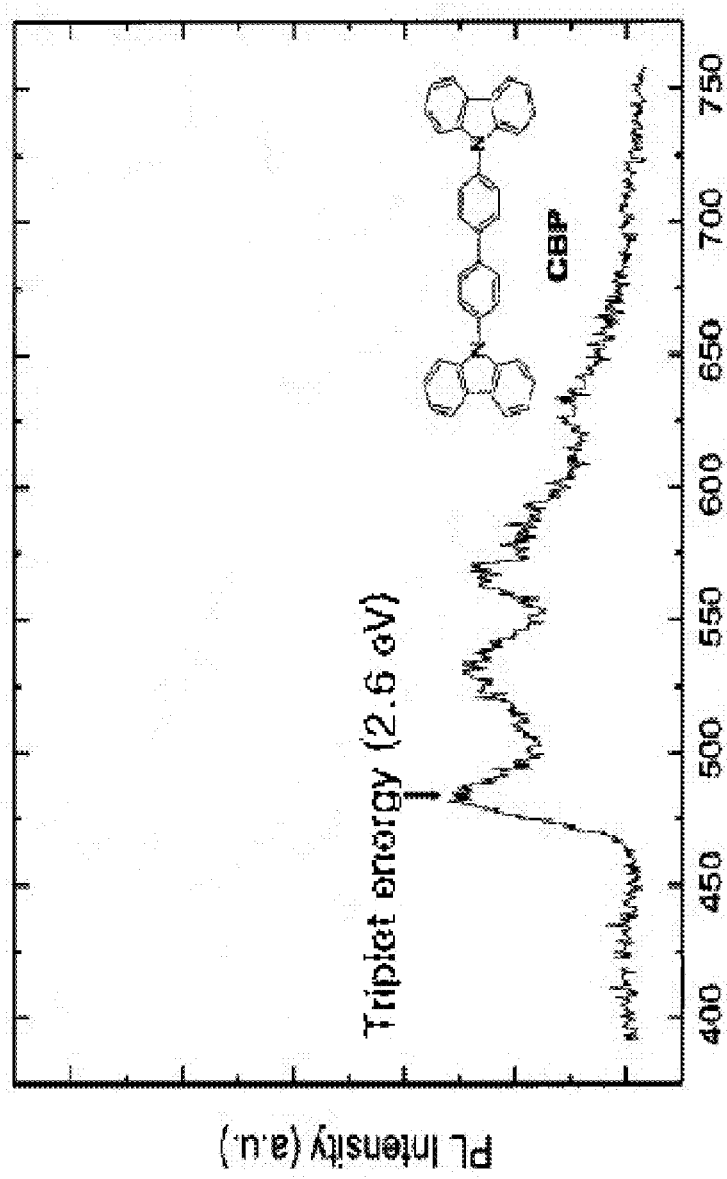
FIG. 1 is a graph showing a photoluminescence (PL) spectrum of CBP as a host for the related art OLED device.

Reference will now be made in detail to the preferred embodiments, examples of which are illustrated in the accompanying drawings.

A phosphorescent compound according to the present invention is represented by following Formula 2. The phosphorescent compound includes a pyridine core and first and second substituents symmetrically or asymmetrically substituted at 2 and 6 positions of the pyridine core. Each of the first and second substituents independently includes an aromatic group (aromatic compound) or a heterocyclic group (heterocyclic compound). As a result, the phosphorescent compound of the present invention has high triplet energy and broad energy band gap.

[Formula 2]

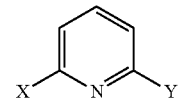

In the above Formula 2, each of X and Y is independently selected from an aromatic compound and a heterocyclic compound. X and Y are same or different.

For example, each of X and Y may be selected from carbazole, α-carboline, β-carboline, γ-carboline, pyridine, phenyl, dibenzofuran, which are represented in following Formula 3, and their derivatives. The substituent of each of X and Y may be carbazole, α-carboline, β-carboline, γ-carboline and dibenzofuran.

[Formula 3]

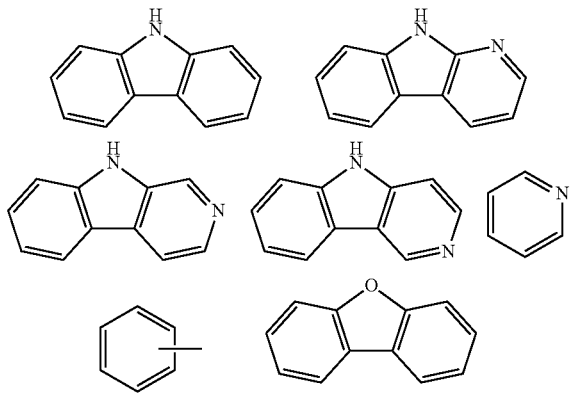

Particularly, the phosphorescent compound of the present invention includes carbazole, which has strong hole property and high triplet energy, and carboline, which has a strong electron property, asymmetrically substituted at 2 and 6 positions of pyridine core, which has a strong electron property, such that a charge balancing characteristic of hole and electron is improved. As a result, the phosphorescent compound has a desired energy band gap for a target dopant and a high triplet energy.

For example, the phosphorescent compound of the above Formula 2 may be one of materials in following Formula 4.

[Formula 4]

New Host_1

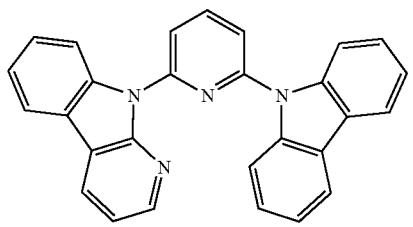

New Host_2

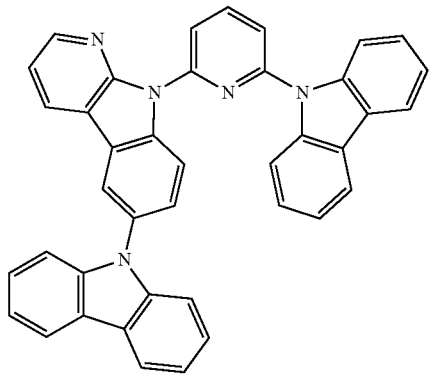

New Host_3

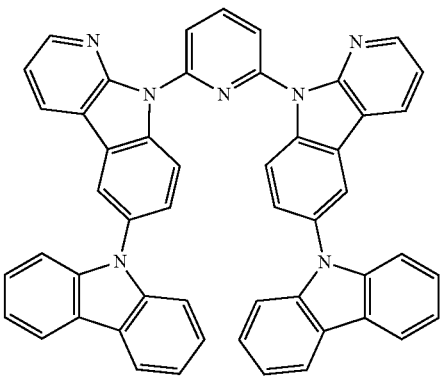

New Host_4

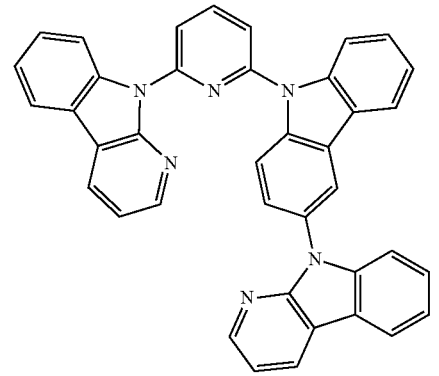

New Host_5

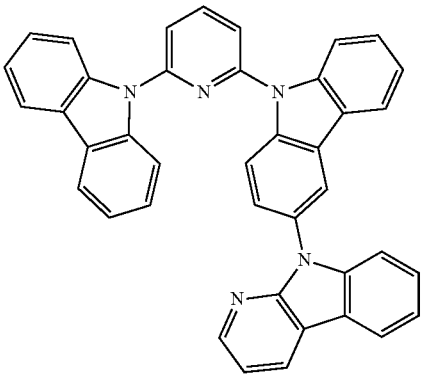

New Host_6

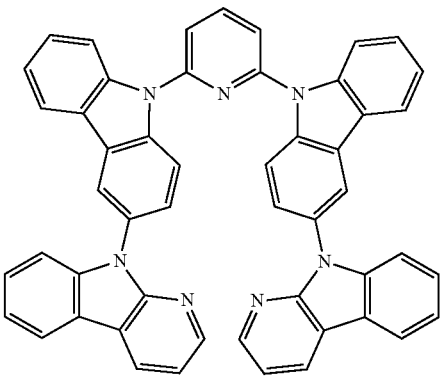

New Host_7
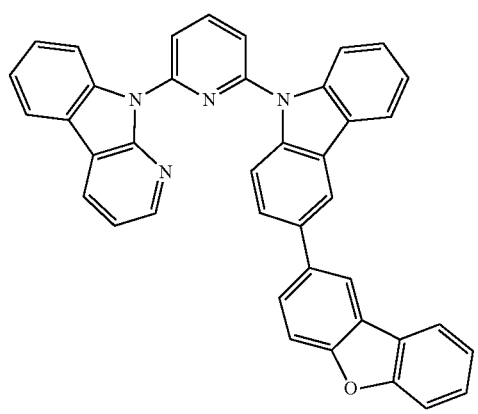
New Host_8
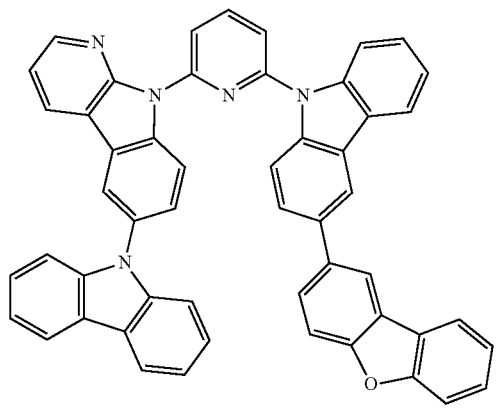
New Host_9
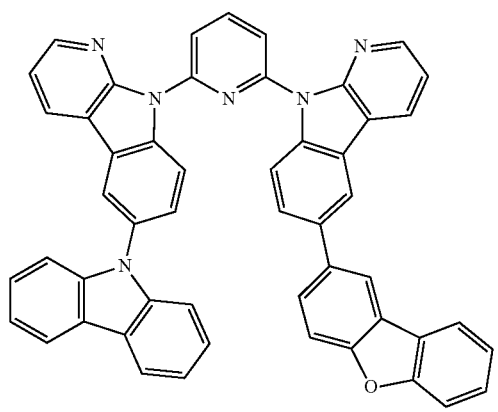
New Host_10
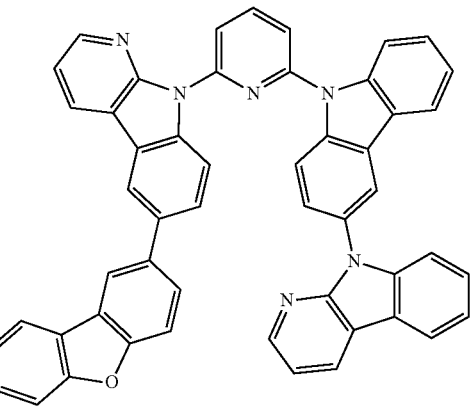
New Host_11
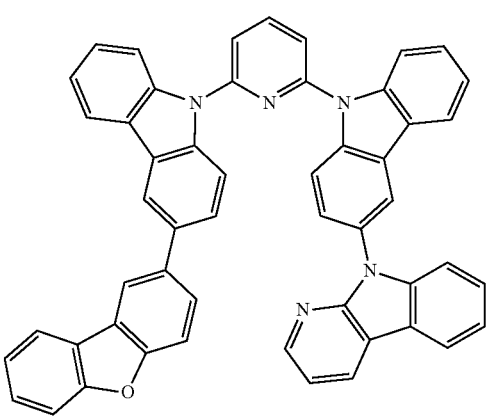
New Host_12
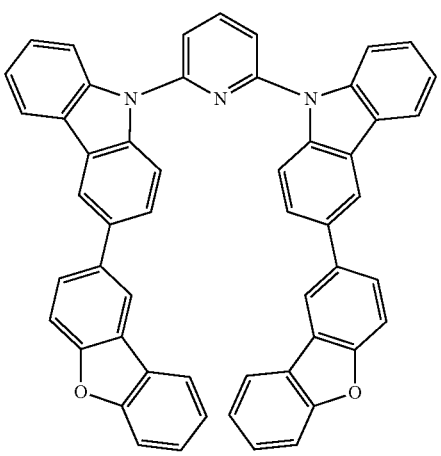
The phosphorescent compound of the present invention has improved emitting efficiency due to the high triplet energy and the broad energy band gap.

The "New Host__1" compound and the "New Host__2" compound in the above Formula 4 are synthesized by following synthesis.

1. "New Host__1" Compound (1) Synthesis of 2,6-diiodopyridine 2,6-diiodopyridine was synthesized by following Reaction Formula 1.

[Reaction Formula 1]

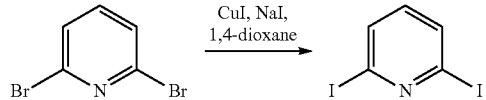

2,6-dibromopyridine (20.0 g, 84.427 mmol), CuI (3.86 g, 20.263 mmol), NaI (50.62 g, 33.708 mmol) and 1,2-diyclohexanedimethyldiamine (5.86 mL, 37.148 mmol) were put in a 250 ml two-neck flask and resolved in 1,4-dioxane. The resultant was refluxed for 12 hours. After completion of the reaction, the reaction mixture was distilled under a reduced pressure to remove solvent. Then, the resultant was column-filtered (hexane:methylene chloride=3:1), and the filtered solution was distilled under a reduced pressure. The resultant was re-crystallized in solution of methylene chloride and petroleum ether such that white powders (9.88 g, yield: 35%) were obtained.

(2) Synthesis of 9-(6-iodopyridin-2-yl)-9H-pyrido[2,3-b]indole 9-(6-iodopyridin-2-yl)-9H-pyrido[2,3-b]indole was synthesized by following Reaction Formula 2.

[Reaction Formula 2]

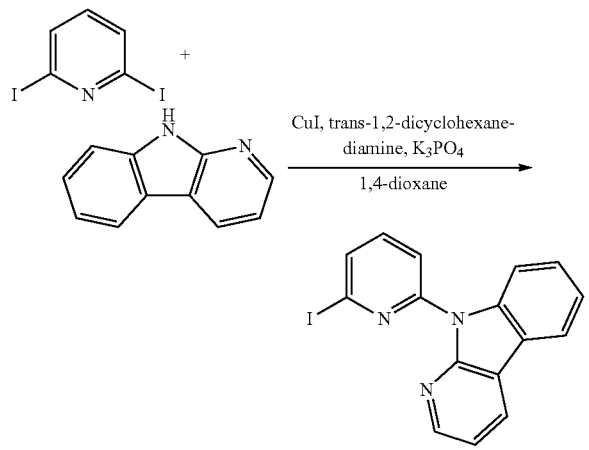

2,6-diiodopyridine (4.13 g, 12.486 mmol), carboline (1.0 g, 5.946 mmol), CuI (113 mg, 0.595 mmol), K3PO4 (6.94 g, 32.703 mmol), trans-1,2-dicyclohexanediamine (0.22 ml, 1.843 mmol) were put in a 250 ml two-neck flask and resolved in 1,4-dioxane. The resultant was refluxed for 12 hours. After completion of the reaction, the reaction mixture was distilled under a reduced pressure to remove solvent. Then, the resultant was column-filtered (hexane:ethylacetate=8:1→hexane: methylene chloride=2:1). The filtered solution was distilled under a reduced pressure such that liquid wax phase 9-(6-iodopyridin-2-yl)-9H-pyrido[2,3-b]indole (2.39 g, yield: 100%) were obtained.

(3) Synthesis of New Host__1

New Host__1 compound was synthesized by following Reaction Formula 3.

[Reaction Formula 3]

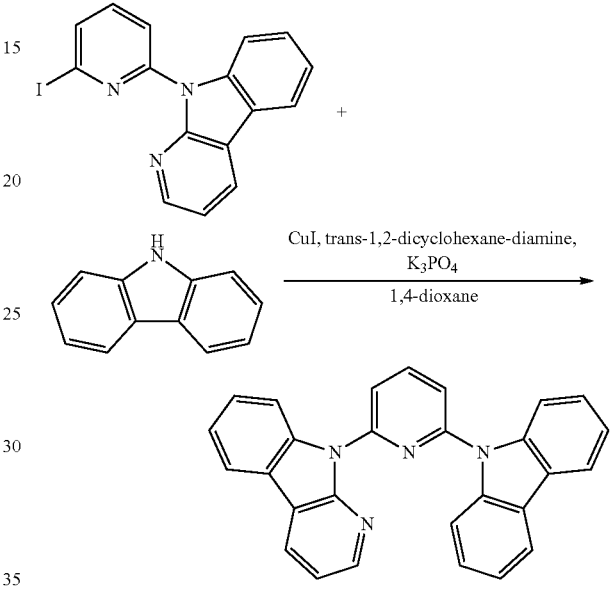

9-(6-iodopyridin-2-yl)-9H-pyrido[2,3-b]indole (2.39 g, 6.439 mmol), carbazole (1.08 g, 6.439 mmol), CuI (123 mg, 0.644 mmol), K3PO4 (7.52 g, 35.41 mmol), trans-1,2-dicyclohexanediamine (0.24 ml, 1.996 mmol) were put in a 250 ml two-neck flask and resolved in 1,4-dioxane. The resultant was refluxed for 12 hours. After completion of the reaction, the reaction mixture was distilled under a reduced pressure to remove solvent. Then, the resultant was column-filtered (hexane:methylene chloride=3:1→1:1), and the filtered solution was distilled under a reduced pressure. The resultant was re-crystallized in solution of methylene chloride and petroleum ether such that white solids (1.50 g, yield: 81%) were obtained.

1. "New Host__2" Compound (1) Synthesis of 6-bromo-9-(6-iodopyridin-2-yl)-9H-pyrido[2,3-b]indole 6-bromo-9-(6-iodopyridin-2-yl)-9H-pyrido[2,3-b]indole was synthesized by following Reaction Formula 4.

[Reaction Formula 4]

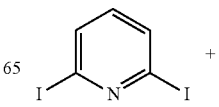

-continued

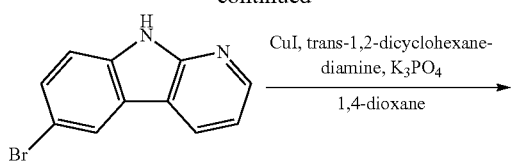

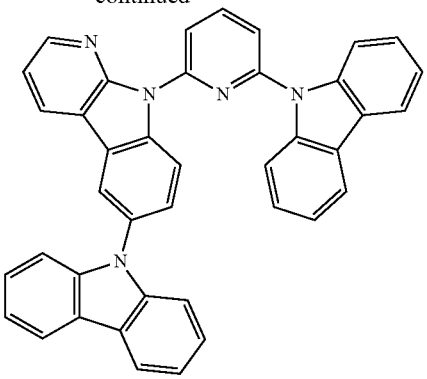

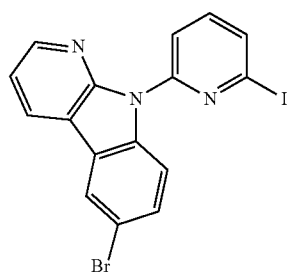

2,6-diiodopyridine (6.96 g, 21.045 mmol), 3-bromo-carboline (2.60 g, 10.522 mmol), CuI (200 mg, 1.052 mmol), K3PO4 (12.28 g, 57.871 mmol), trans-1,2-dicyclohexanediamine (0.4 ml, 3.262 mmol) were put in a 250 ml two-neck flask and resolved in 1,4-dioxane. The resultant was refluxed for 12 hours. After completion of the reaction, the reaction mixture was distilled under a reduced pressure to remove solvent. Then, the resultant was column-filtered (hexane:methylene chloride=3:1→2:1), and the filtered solution was distilled under a reduced pressure. The resultant was re-crystallized in solution of methylene chloride and petroleum ether such that white powders (1.37 g, yield: 29%) were obtained.

(2) Synthesis of New Host__2

New Host__2 compound was synthesized by following Reaction Formula 5.

[Reaction Formula 5]

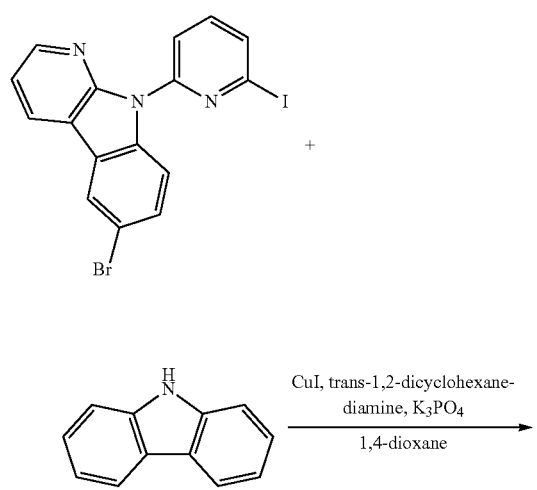

6-bromo-9-(6-iodopyridin-2-yl)-9H-pyrido[2,3-b]indole (1.37 g, 3.044 mmol), carbazole (1.02 g, 6.088 mmol), CuI (145 mg, 0.761 mmol), K3PO4 (7.10 g, 33.484 mmol), trans-1,2-dicyclohexanediamine (0.3 ml, 2.131 mmol) were put in a 250 ml two-neck flask and resolved in 1,4-dioxane. The resultant was refluxed for 12 hours. After completion of the reaction, the reaction mixture was distilled under a reduced pressure to remove solvent. Then, the resultant was short-column-filtered to remove color and was column-filtered again (hexane:methylene chloride=2:1→1:1). The filtered solution was distilled under a reduced pressure and re-crystallized in solution of methylene chloride and petroleum ether such that white solids (0.40 g, yield: 23%) were obtained.

Figure 2:
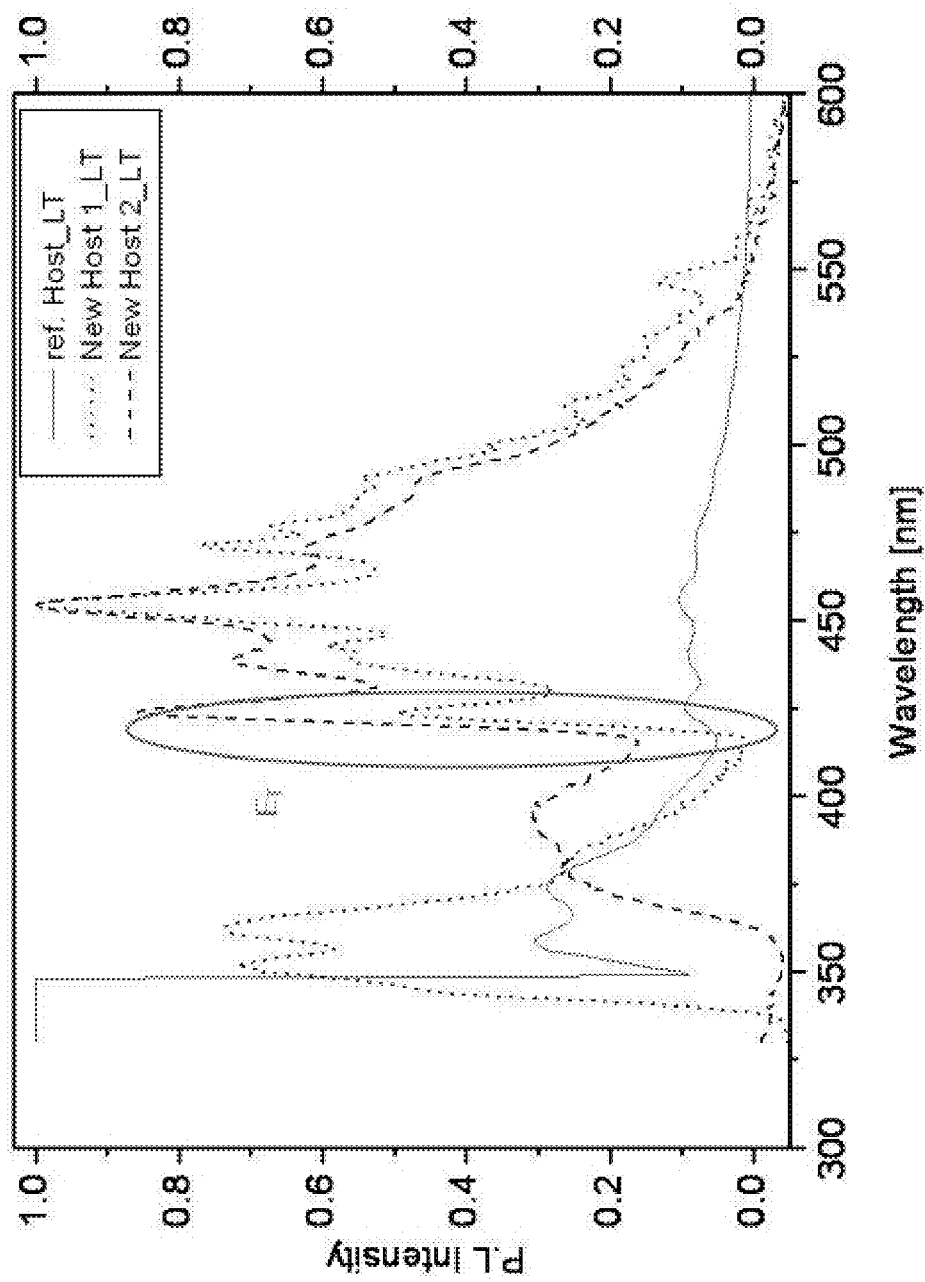
FIG. 2 is a PL spectrum of a phosphorescent compound according to the present invention.
Figure 3:
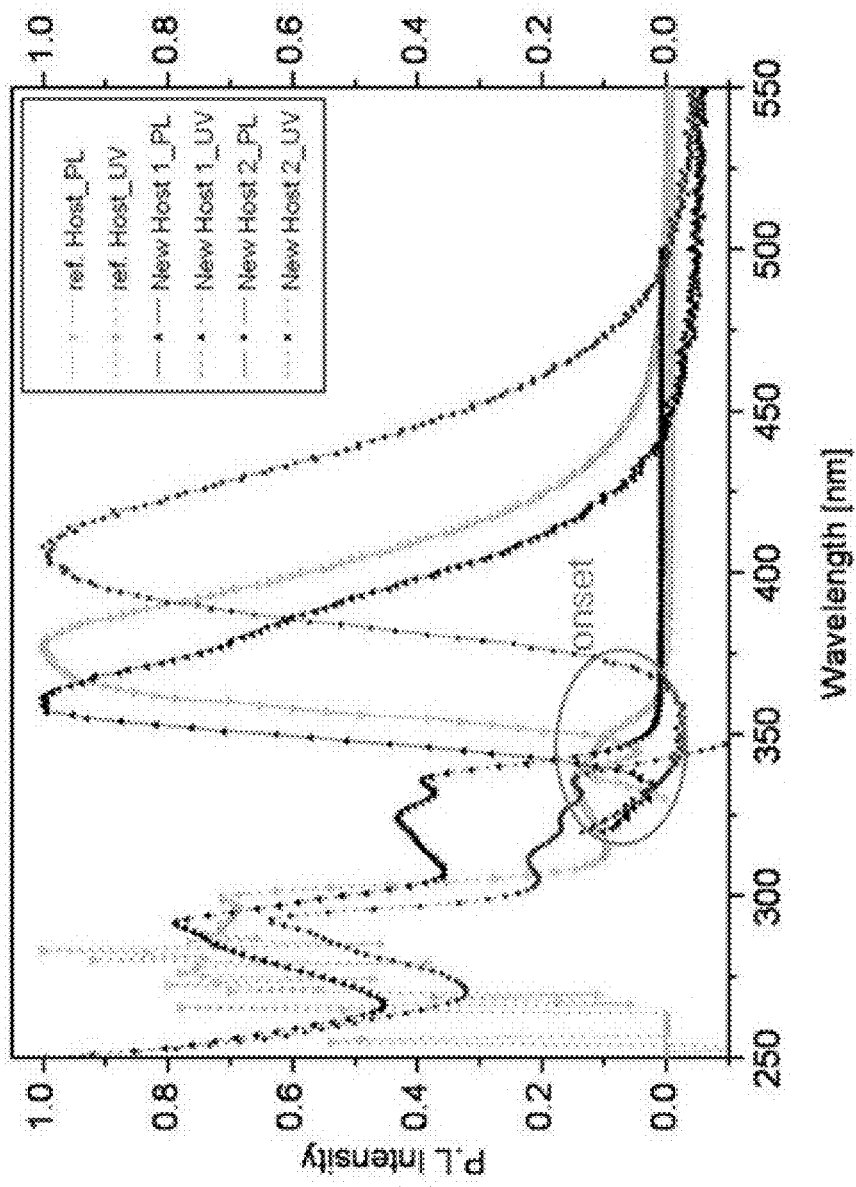
FIG. 3 is a graph showing a UV spectrum and a PL spectrum of a phosphorescent compound according to the present invention.

FIG. 2 shows a PL spectrum of a reference host "ref. Host", which is represented by following Formula 5, and phosphorescent compounds "New Host__1 and New Host__2" according to the present invention. FIG. 3 shows a UV spectrum and a PL spectrum of the reference host "ref. Host" and the phosphorescent compounds "New Host__1 and New Host__2" according to the present invention. Properties of the reference host "ref. Host" and the phosphorescent compounds "New Host__1 and New Host__2" are listed in Table 1.

[Formula 5]

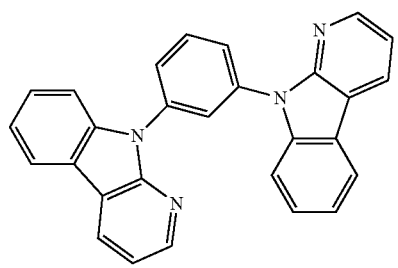

TABLE 1

|  | λ abs | $\lambda_{FL}$ | Band gap energy | HOMO [eV] | $E_T$ [eV] |
|---|---|---|---|---|---|
| ref. Host | 365 | 425 | 3.40 | −5.83 | 2.92 |
| New Host__1 | 349 | 424 | 3.56 | −5.84 | 2.93 |
| New Host__2 | 367 | 424 | 3.38 | −5.69 | 2.93 |

As shown in FIGS. 2 and 3 and Table 1, the phosphorescent compounds "New Host__1 and New Host__2" of the present invention has the energy band gap, i.e., above 3.3 eV and the triplet energy ($E_T$), above 2.8 eV.

Namely, similar to the reference host, the phosphorescent compound of the present invention has the triplet energy larger than that of CBP used as a host material in the related art OLED device. In addition, since the triplet energy of the phosphorescent compound of the present invention is larger than dopant, a problem of an energy counter-transition from the dopant to the host is prevented.

Moreover, emission efficiency of the phosphorescent compound of the present invention is improved due to the board energy band gap. Furthermore, since the phosphorescent compound of the present invention has a stronger electron property than the reference host, a charge valance is increased such that the emission efficiency is further improved.

Hereinafter, a detailed description will be made of preferred examples associated with the OLED device according to the present invention. More specifically, the examples relate to an OLED device including an emission material layer which uses the red phosphorescent compound of Formula 2 as a host.

EXAMPLES

Comparative Example

An ITO layer is deposited on a substrate and washed to form an anode. The substrate is loaded in a vacuum chamber, and a hole injecting layer (50 Å) of hexaazatriphenylene-hexacarbonitrile (HAT-CN), a hole transporting layer (550 Å) of 4-4'-bis[N-(1-naphtyl)-N-phenylamino]-biphenyl (NPB), an electron blocking layer (100 Å) of TAPC, which is represented by following Formula 6, an emitting material layer (300 Å) of the reference host in the above Formula 5 and a blue dopant (15%) of FCNIr, which is represented by following Formula 7, an electron transporting layer (400 Å) of TmPyPB, which is represented by following Formula 8, an electron injecting layer (5 Å) of LiF, and a cathode (1100 Å) of aluminum are sequentially formed on the anode.

Example

An ITO layer is deposited on a substrate and washed to form an anode. The substrate is loaded in a vacuum chamber, and a hole injecting layer (50 Å) of hexaazatriphenylene-hexanitrile (HAT-CN), a hole transporting layer (550 Å) of 4-4'-bis[N-(1-naphtyl)-N-phenylamino]-biphenyl (NPB), an electron blocking layer (100 Å) of TAPC, an emitting material layer (300 Å) of the "New Host_1" phosphorescent compound in the above Formula 4 and a blue dopant (15%) of FCNIr, an electron transporting layer (400 Å) of TmPyPB, an electron injecting layer (5 Å) of LiF, and a cathode (1100 Å) of aluminum are sequentially formed on the anode.

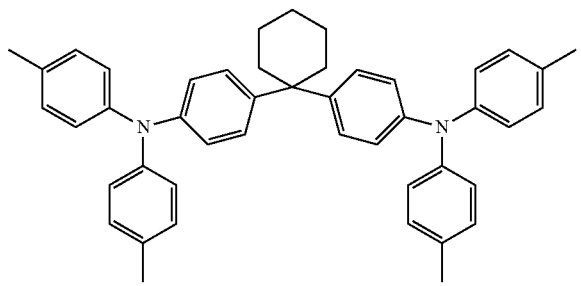

[Formula 6]

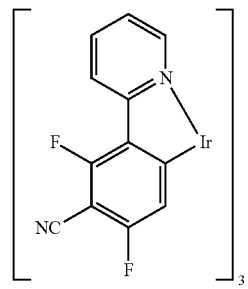

[Formula 7]

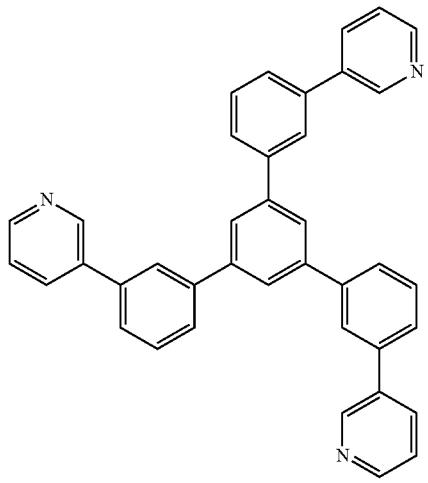

[Formula 8]

Figure 4A:
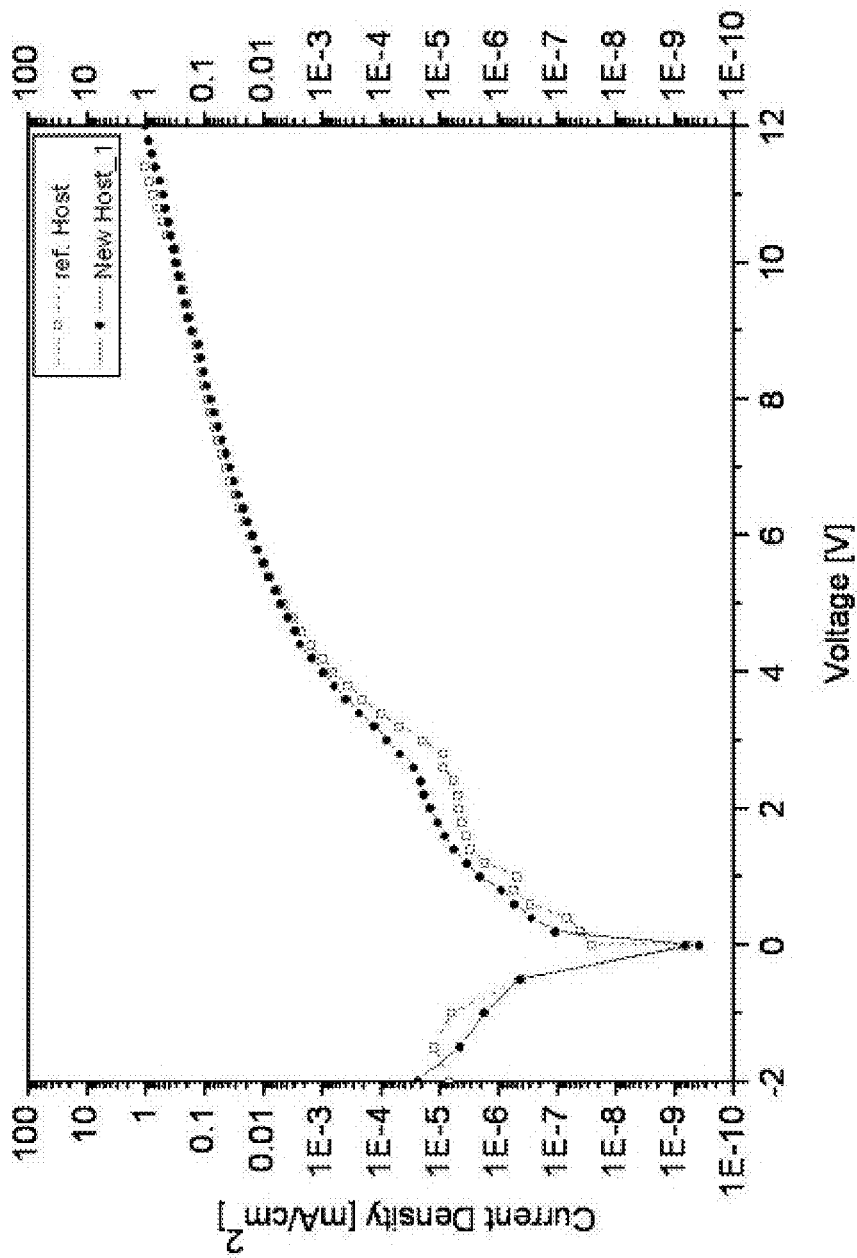
FIGS. 4A to 4C are graphs respectively showing current density, current efficiency and power efficiency of a phosphorescent compound according to the present invention.
Figure 4B:
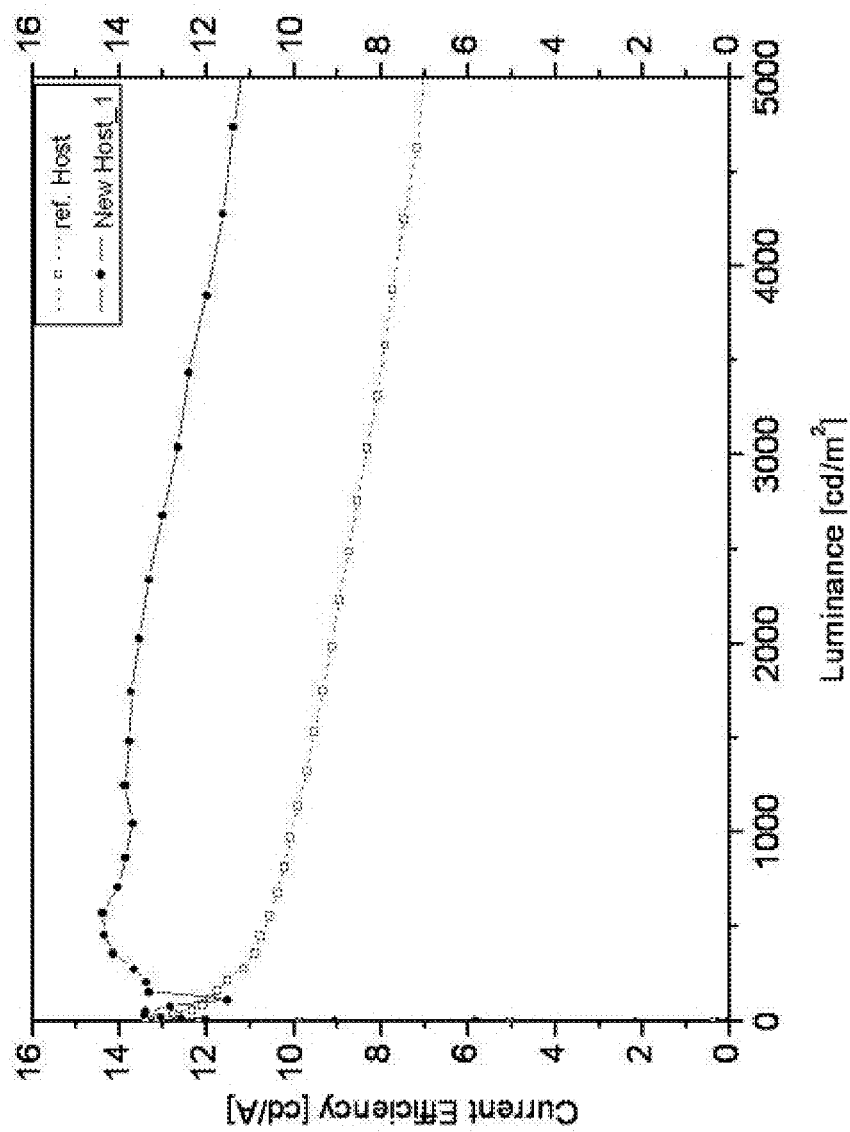
Figure 4C:
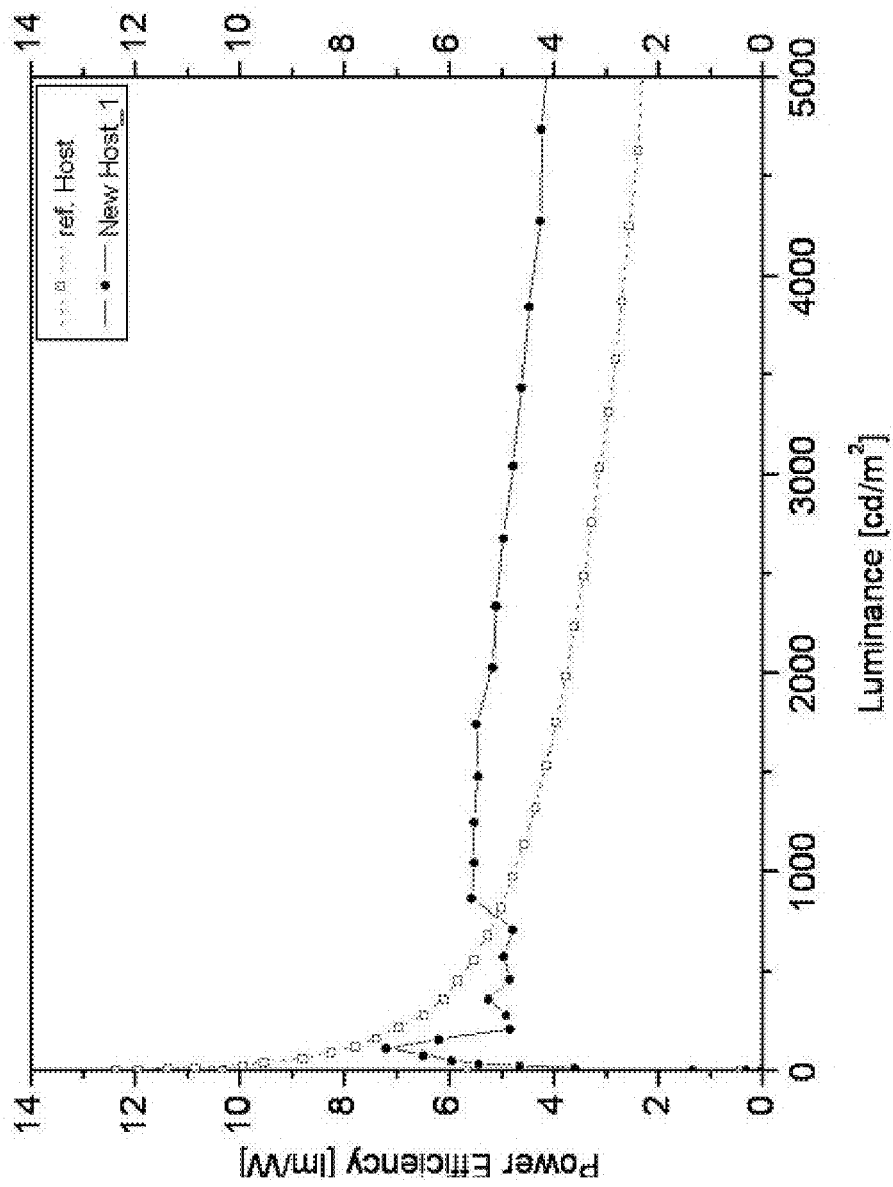

Properties of the OLED device of the comparative example and the example are listed in Table 2, and a graph showing current density, current efficiency and power efficiency is shown in FIGS. 4A to 4C.

TABLE 2

|  | Volt [V] | J[mA/ cm$^2$] | Cd/m$^2$ | Cd/A | Lm/W | CIE(x) | CIE(y) |
| --- | --- | --- | --- | --- | --- | --- | --- |
| ref. Host | 6.6 | 9.67 | 974.20 | 10.07 | 4.79 | 0.187 | 0.340 |
| New Host_1 | 6.6 | 10.77 | 1483.00 | 13.77 | 5.45 | 0.183 | 0.324 |

Referring to Table 2 and FIGS. 4A to 4C, the OLED device using the phosphorescent compound of the present invention has advantages in current efficiency, power efficiency, brightness, and so on. Accordingly, the OLED device using the phosphorescent compound of the present invention in the emitting material layer displays high brightness images and has low power consumption.

Figure 5:
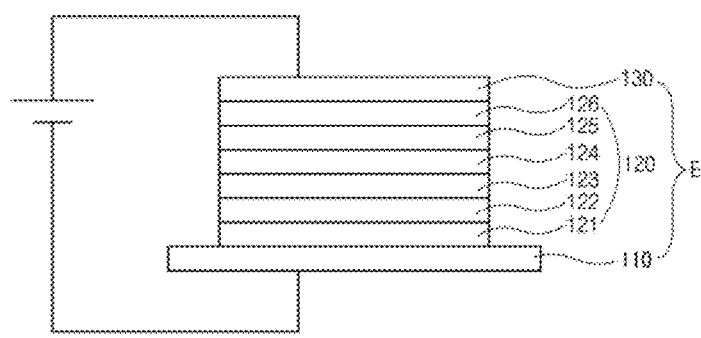
FIG. 5 is a schematic cross-sectional view of an OLED device according to the present invention.

Referring to FIG. 5, which is a schematic cross-sectional view of an OLED device according to the present invention, the OLED device includes a first substrate (not shown), a second substrate (not shown) and an organic emitting diode E between the first and second substrates.

The organic emitting diode E includes a first electrode 110, a second electrode 130 and an organic emitting layer 120. The first electrode 110 is formed of a material having a relatively high work function to serve as an anode. For example, the first electrode 110 may be formed of indium-tin-oxide (ITO). The second electrode 130 is formed of a material having a relatively low work function to serve as a cathode. For example, the second electrode 130 may be formed of aluminum (Al) or Al alloy.

The organic emitting layer 120 includes red, green and blue organic emitting pattern. To increase emission efficiency, the organic emitting layer 120 includes a hole injecting layer (HTL) 121, a hole transporting layer (HIL) 122, an electron blocking layer 123, an emitting material layer (EML) 123, an electron transporting layer (ETL) 124 and an electron injecting layer (EIL) 125.

The emitting material layer 123 includes the phosphorescent compound in the above Formula 2.

For example, when the emitting material layer 123 includes the phosphorescent compound in the above Formula 2 as a host, a dopant is doped such that the emitting material layer 123 emits blue light. Since the phosphorescent compound as the host has the triple energy larger than the dopant, an energy counter-transition from the dopant to the host is prevented. As a result, emission efficiency is improved. In addition, the emission efficiency is further improved due to the board energy band gap of the phosphorescent compound of the present invention.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A phosphorescent compound of following formula:

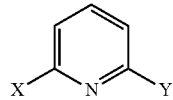

wherein X is substituted or non-substituted carbazole, and Y is substituted or non-substituted carboline.

2. The compound according to claim 1, wherein a substituent of each of X and Y is independently selected from the group consisting of carbazole, carboline and dibenzofuran.

3. An organic light emitting diode device, comprising:
a first electrode;
a second electrode facing the first electrode; and
an emitting material layer between the first and the second electrodes, wherein the emitting material layer includes a phosphorescent compound of following formula:

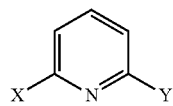

wherein X is substituted or non-substituted carbazole, and Y is substituted or non-substituted carboline.

4. The device according to claim 3, wherein a substituent of each of X and Y is independently selected from the group consisting of carbazole, carboline and dibenzofuran.

5. The device according to claim 3, further comprising:
a hole injecting layer between the first electrode and the emitting material layer;
a hole transporting layer between the emitting material layer and the hole injecting layer;
an electron injecting layer between the second electrode and the emitting material layer; and
an electron transporting layer between the emitting material layer and the electron injecting layer.

6. The compound according to claim 1, wherein the compound is selected from the following:

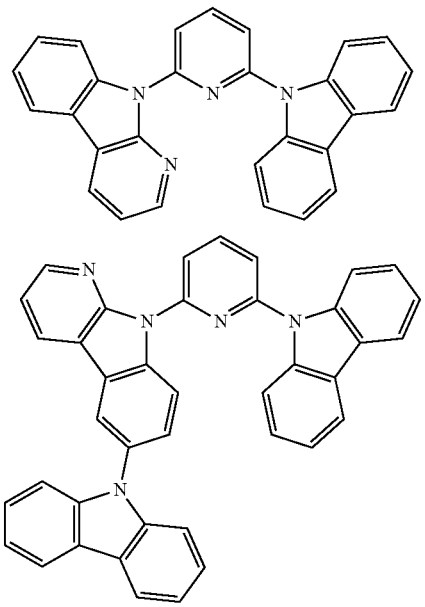

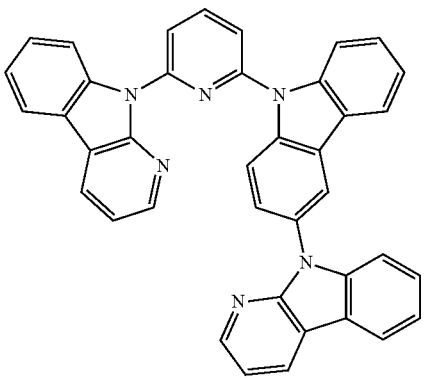

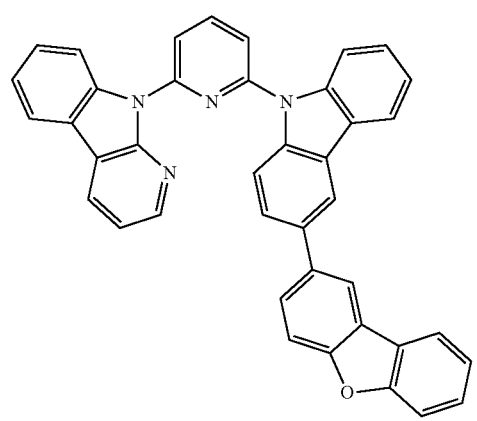

-continued
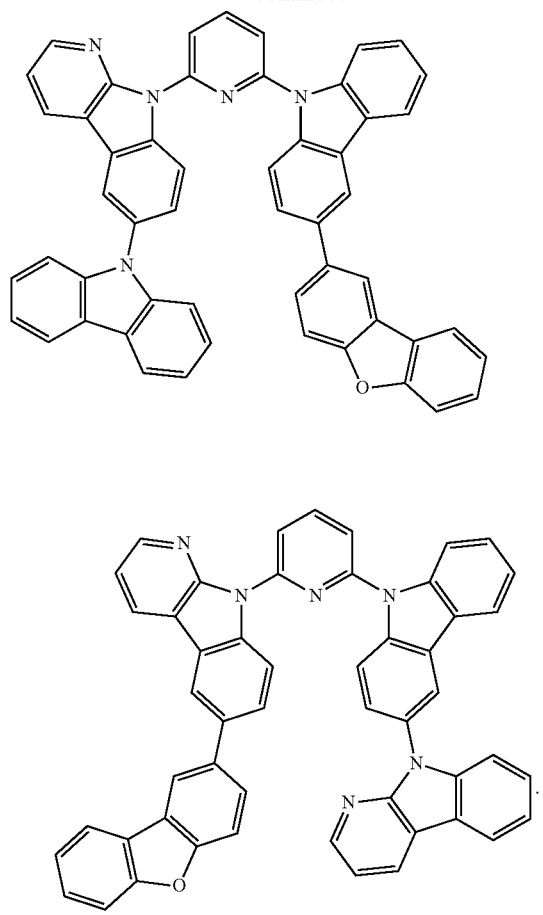
7. The device according to claim 3, wherein the phosphorescent compound is selected from the following:
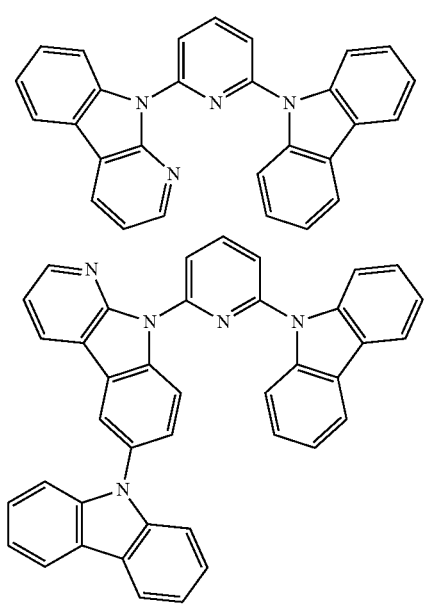
-continued
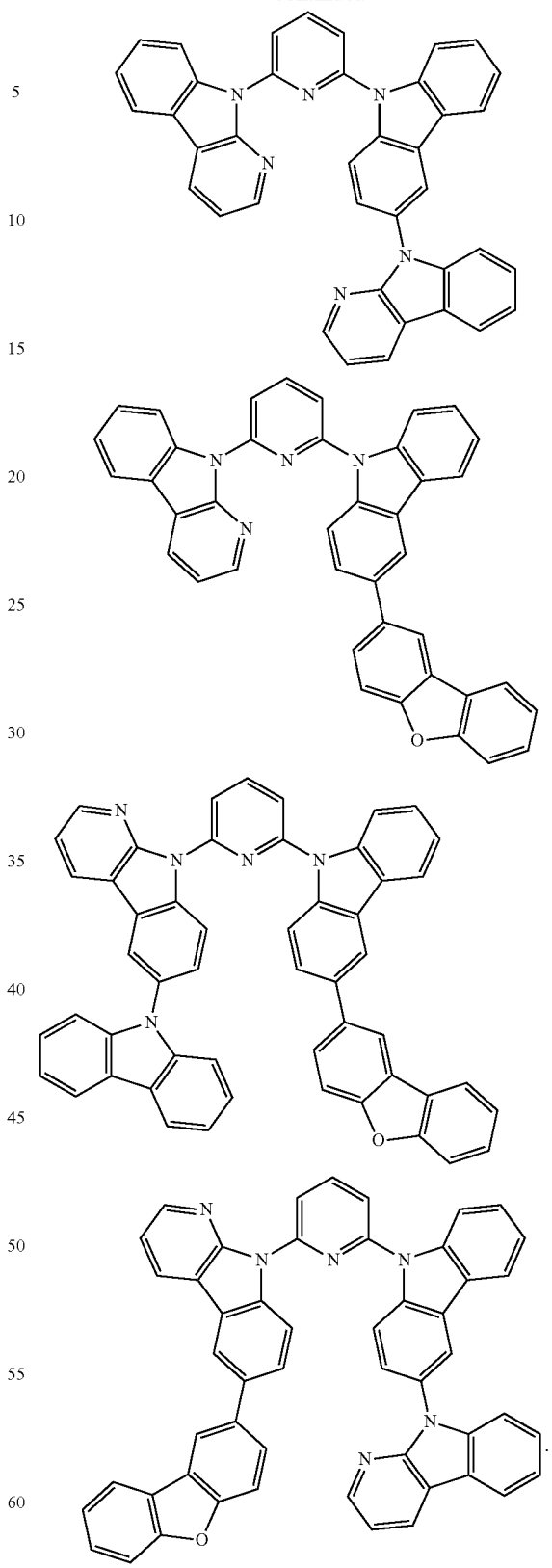
8. The device according to claim 3, wherein the phosphorescent compound is used as a host, and the emitting material layer further includes a dopant.

9. The device according to claim 8, wherein the host has a triplet energy larger than the dopant.

10. The device according to claim 3, wherein the emitting material layer emits blue light.

11. A phosphorescent compound of following formula:

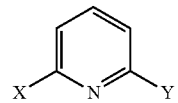

X is non-substituted carbazole, and Y is substituted or non-substituted carboline.

12. The compound according to claim 11, wherein a substituent of Y is selected from the group consisting of carbazole, carboline and dibenzofuran.

\* \* \* \* \*